United States Patent
Machado Pinto Brasil

(10) Patent No.: US 10,534,035 B2
(45) Date of Patent: Jan. 14, 2020

(54) AUTOMATED TEST EQUIPMENT AND ITS OPERATION METHOD

(71) Applicant: DIVMAC-PROJECTOS, AUTOMATISMOS E PERIFERICOS INDUSTRIAIS, S.A, Guimaraes (PT)

(72) Inventor: Manuel Machado Pinto Brasil, Santo Tirso (PT)

(73) Assignee: DIVMAC—PROJECTOS, AUTOMATISMOS E PERIFERICOS INDUSTRIALS, S.A., Guimaraes (PT)

( * ) Notice: Subject to any disclaimer, the term of this patent is extended or adjusted under 35 U.S.C. 154(b) by 31 days.

(21) Appl. No.: 15/770,575

(22) PCT Filed: Nov. 7, 2016

(86) PCT No.: PCT/IB2016/056694
§ 371 (c)(1),
(2) Date: Apr. 24, 2018

(87) PCT Pub. No.: WO2017/077519
PCT Pub. Date: May 11, 2017

(65) Prior Publication Data
US 2018/0321317 A1    Nov. 8, 2018

(30) Foreign Application Priority Data
Nov. 6, 2015 (PT) .......................... 108938

(51) Int. Cl.
*G01R 31/327* (2006.01)
(52) U.S. Cl.
CPC ....... *G01R 31/3274* (2013.01); *G01R 31/327* (2013.01); *G01R 31/3278* (2013.01)

(58) Field of Classification Search
CPC ............ G01R 31/3274; G01R 31/3278; G01R 31/327
See application file for complete search history.

(56) References Cited

U.S. PATENT DOCUMENTS 3,936,612 A    2/1976    Hjortendal et al.
5,124,638 A *  6/1992    Winroth ............. G01R 31/2834
                                                    324/73.1
(Continued)

OTHER PUBLICATIONS

Switching Handbook, A Guide to Signal Switching in Automated Test Systems, 6th ed, Keithley Instruments, Inc., 2008 (Year: 2008).*

(Continued)

*Primary Examiner* — Daniel R Miller
(74) *Attorney, Agent, or Firm* — Lucas & Mercanti, LLP

(57) ABSTRACT

The present application arises from the need of associating a switching matrix comprising electromechanical relays with a switching matrix comprising solid-state relays. Disclosed herein is an automated test equipment comprising an electronic controller, at least two measuring signals, at least one switching matrix comprising at least two electromechanical relays for each test point, and at least a switching matrix comprising at least one test point and at least two solid-state relays for each test point. In this equipment, each test point in a switching matrix comprising electromechanical relays is connected to a test point of the other switching matrix comprising solid-state relays, via an electromechanical relay. In practice, a reduction by half of the test time at the low voltage step is observed.

5 Claims, 2 Drawing Sheets

(56) References Cited

U.S. PATENT DOCUMENTS

| | | | | |
|---|---|---|---|---|
| 5,861,743 A | * | 1/1999 | Pye | G01R 31/2806 324/763.01 |
| 6,100,815 A | * | 8/2000 | Pailthorp | H01H 67/30 324/754.07 |
| 6,157,185 A | | 12/2000 | Stone et al. | |
| 8,384,410 B1 | * | 2/2013 | De La Puente | G01R 31/31926 324/762.02 |
| 2005/0275405 A1 | | 12/2005 | Hiramatsu | |
| 2013/0082731 A1 | | 4/2013 | Lou et al. | |

OTHER PUBLICATIONS

International Search Report and Written Opinion dated Feb. 22, 2017 for PCT/IB2016/056694.

* cited by examiner

AUTOMATED TEST EQUIPMENT AND ITS OPERATION METHOD

CROSS REFERENCE TO RELATED APPLICATION

This Application is a 371 of PCT/IB2016/056694 filed on Nov. 7, 2016, which claims priority of Portuguese Application No. 108938 filed Nov. 6, 2015, both of which are incorporated herein by reference.

TECHNICAL DOMAIN

The present application relates to an automated test equipment and its operation method.

BACKGROUND

Currently, one observes a wide use of automated test equipment (Automated Test Equipment—ATE) to test one or several electrical devices, and to ensure that a series of specific switching sequences or combinations is observed. The automation of the test process making use of these devices brings several advantages to the development process, allowing to minimize inaccuracies and eliminate errors due to human factors.

In the context of electrical test systems for equipment, subassemblies, electronic cards or wiring, ATEs comprising switching matrices are used with the purpose of directing several signals and power to different points on the devices to test.

Known solutions showed to involve significant manual intervention, for instance, the electrical validation of a wiring might take days or even weeks, depending on its dimension and quantity of errors that the test system may identify.

Moreover, in some cases they present slow switching and the wear thereof, resulting from the use of its components. In such circumstances, it becomes mandatory to periodically replace all or part of the components on the switching matrix, for example due to an operation failure or due to a significant drift from its initial specifications, with consequences on the tests performed.

It is also observed an undesirable competitive relation between the switching frequency range and the operation voltage range permitted: a solution that reaches high switching rates, only allows low voltage tests; while a solution allowing high voltage tests can only reach low switching rates.

In what concerns existing disclosures of the state of the art, document U.S. Pat. No. 7,053,624 B2 generally describes a test system for protection relays and their surroundings, namely the different characteristics and conditions where the simulation might occur.

In document U.S. Pat. No. 8,299,798 B2 described is a system having the objective of evaluating the state of relays and in particular arrays of relays, as switching matrices, aiming at isolating and identifying failures using elaborated algorithms. The whole document is focused on the test of relays in the context of groups of relays, making use of switching matrices, with the purpose of isolating the failures in an efficient way.

The document U.S. Pat. No. 9,165,735 B2 describes also a test system that, instead of using simple relays as switches of the switching matrix(ces), uses "compound switches" consisting in the association of electromechanical relays with solid-state relays ("optoMOSFET") in order to create a more robust and enduring switch. The state change of the contact of the "compound switch" is carried out in a sequential and timed way as described in the various contexts, involving a more complex control system. Furthermore, and in a real context with thousands of test points, this solution shows some disadvantages related to the fact that this is an approach requiring much more space, which is normally very limited, since it requires a control system to manage the sequence and timing of each state change of the contact, the intrinsic wear of the switches and switching time of the electromechanical relays, and due to the associated added cost.

GENERAL DESCRIPTION

The present application arises from the need of associating a switching matrix comprising electromechanical relays with a switching matrix comprising solid-state relays.

Disclosed herein is an automated test equipment, comprising:
  an electronic controller, comprising a non-volatile memory;
  at least two measuring signals, negative and positive;
  at least one switching matrix comprising at least one test point and at least two electromechanical relays for each test point, each relay connected between a measuring signal and the test point;
  at least one switching matrix comprising at least one test point and at least two solid-state relays for each test point, each relay connected between a measuring signal and the test point,
wherein each test point in a switching matrix comprising electromechanical relays is connected to a test point of the other switching matrix comprising solid-state relays, via an electromechanical relay.

In one embodiment, each measuring signal is connected to the switching matrix comprising at least two solid-state relays, via an electromechanical relay.

In another embodiment, each measuring signal is connected to at least two switching matrices via an electromechanical relay.

Yet in another embodiment, the electronic controller comprises:
  a main electronic controller;
  at least one sub-controller of test points module;
  at least one test points card,
wherein the main electronic controller is connected to the at least one sub-controller of test points module, which in turn is connected to the at least one test points card.

This implementation allows to reach a wider system modularity, providing several advantages for the adaptation to the different tests which complexity depends, for example, on the number of test points, on the maximum test voltage or on the maximum current.

The present application further discloses an operation method of an automated test equipment, comprising the steps:
  the electronic controller reads an instruction from the non-volatile memory;
  the electronic controller deactivates the at least one electromechanical relay between the test points;
  the electronic controller activates the at least one electromechanical relay between the test points and deactivates the at least two relays in the switching matrix comprising at least two electromechanical relays.

In one embodiment, the electronic controller is configured to implement the method described herein.

Described is an automated test equipment based on a hybrid switching matrix which in turn comprises two distinct switching matrices, a traditional electromechanical relays switching matrix and a solid-state switching matrix. These two switching matrices operate in exclusive mode— when one is in operation the other one is inactive. The solid-state switching matrix is used in a first step in which the number of commutations is normally much larger since there are normally errors that are identified and thus have to be corrected. Making use of the solid-state switching matrix in this first phase causes on one hand the process to be much faster and on the other hand the switches not to get worn. Only in an ulterior test step, after the validation of the first step which uses only the solid-state matrix, the system commutates to the switching matrix that uses electromechanical relays to perform the more accurate tests and the high voltage tests, but because there has been a previous validation, the likelihood of still existing problems, which would involve additional commutations, is much lower.

In practice, it is intended that a switching matrix is flexible concerning the high number of test points it allows, and also concerning its operating voltage ranges, reaching, for instance, both low voltage tests, for example 28 V, and insulation and dielectric strength tests between 50 and 6000 V or other voltages, depending on the cable category and specific application. Furthermore, it is intended that the components of the switching matrix show low interference on the measurements, physical robustness and high precision.

The present solution significantly reduces wear of the switching matrix relays, since most part of the state changes of the electromechanical relays are now carried out by the solid-state matrix during the error identification and correction step.

It reduces also the test time needed since most part of the state changes is now carried out by the solid-state matrix, which provides a much higher speed compared to the electromechanical relays matrix.

Furthermore, it allows providing more information to the operators regarding the errors found making it easier to solve them, since by using the solid-state matrix there is no wear problem thereof to care about. On the other hand, being the solid-state matrix much faster, obtaining additional information that helps the operator solving the problems doesn't represent any increase of the test time.

Moreover, it significantly reduces the maintenance cost of the ATE switching matrix since the components thereof (relays) subjected to wear are then much less used, being most part of the commutations carried out by the solid-state matrix. A great deal of the maintenance cost of an ATE is normally associated to the maintenance or replacement of the switching matrix.

BRIEF DESCRIPTION OF THE FIGURES

For an easier understanding of the present application figures are appended, which depict preferred implementations that, however, are not meant to limit the art disclosed herein.

DESCRIPTION OF EMBODIMENTS

Reference being made to the figures, some embodiments are now described in a more detailed way, which are not meant, however, to limit the scope of the present application.

Figure 1:
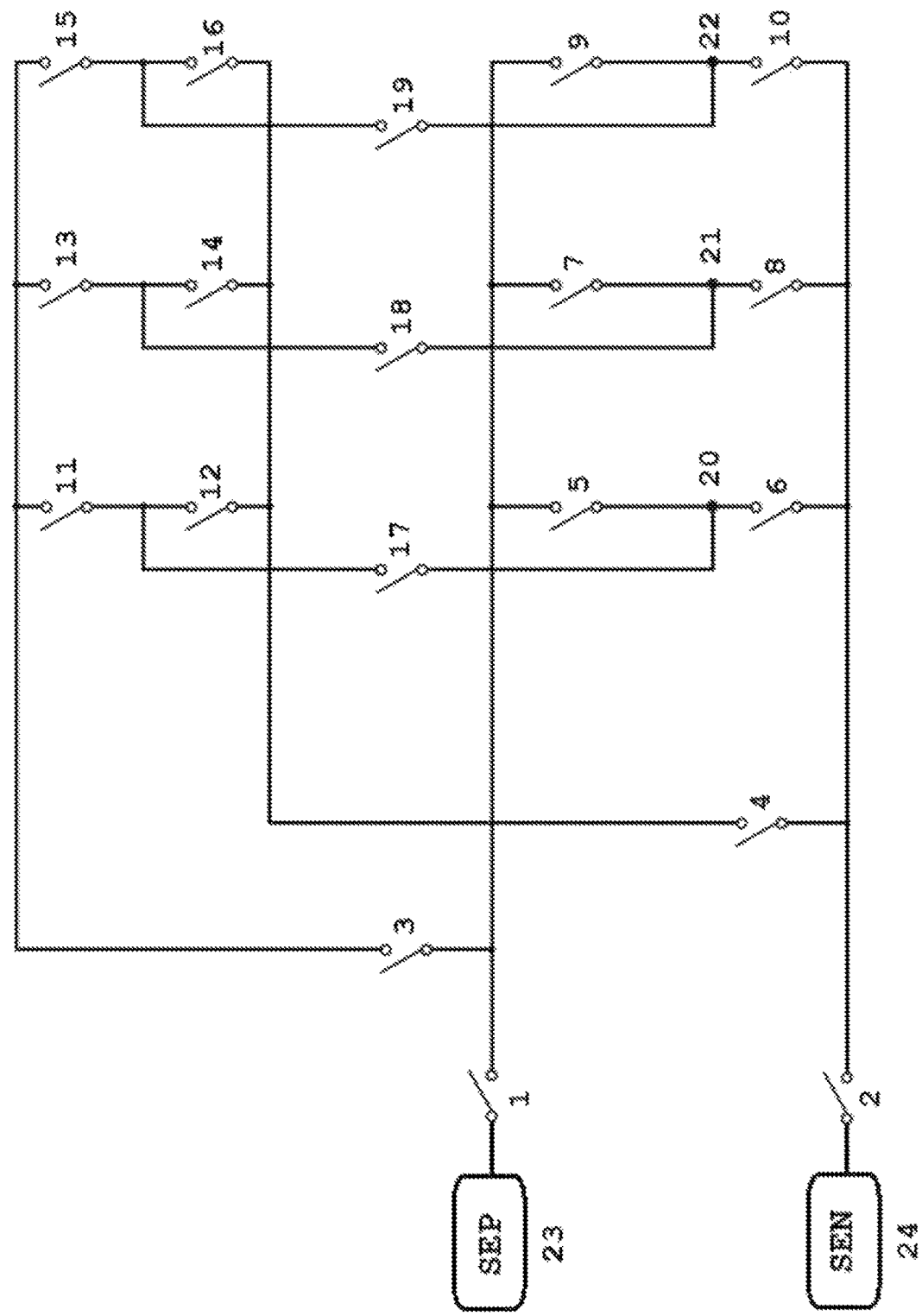
FIG. 1 illustrates an embodiment of the automated test equipment, wherein the reference numbers represent:
1 and 2—Contacts of one or two high voltage electromechanical relays that actuate simultaneously.
3, 4, 17, 18 and 19—Contacts of high voltage electromechanical relays that actuate simultaneously.
5, 7 and 9—Contacts of electromechanical relays.
6, 8 and 10—Contacts of electromechanical relays.
11, 13 and 15—Contacts of solid-state relays.
12, 14 and 16—Contacts of solid-state relays.
20, 21 and 22—Test points of the ATE.
23—Positive measuring signal
24—Negative measuring signal

FIG. 1 illustrates an embodiment of the automated test equipment. The contacts of one or two high voltage electromechanical relays that actuate simultaneously (1, 2) enable to isolate groups of switching matrix test points that are not necessary for the test to be performed in order to minimize the capacitive and resistive effect of the switching matrix on the measurements. The contacts of high voltage electromechanical relays that actuate simultaneously (3, 4, 17, 18 and 19) enable on one hand to isolate the solid-state relays matrix (which are not necessarily relays, they may be other components such as opto-components and/or transistor arrays) during the high voltage test process and on the other hand to establish the contact with the solid-state relays matrix during the low voltage test step. The contacts of electromechanical relays (5, 7 and 9) enable to connect, respectively, the test points with reference numbers 20, 21 and 22, to the measurement signal with the reference number 23 (SEP). The contacts of electromechanical relays (6, 8 and 10) enable to connect, respectively, the test points with reference numbers 20, 21 and 22, to the measurement signal with the reference number 24 (SEN). The contacts of solid-state relays (11, 13 and 15), which are not necessarily relays, they may be other components such as opto-components and/or transistor arrays, enable to connect, respectively, the test points with reference numbers 20, 21 and 22, to the positive measurement signal with reference number 23 via the contact marked with reference number 3. The contacts of solid-state relays (12, 14 and 16), which are not necessarily relays, they may be other components such as opto-components and/or transistor arrays, enable to connect the test points (reference numbers 20, 21 and 22, respectively) to the negative measurement signal with reference number 24 via the contact marked with reference number 4. The ATE test points (20, 21 and 22) are used to connect to the device or wiring to be tested, and through which the necessary measurements are made. In the picture, only 3 points are represented which make part of a group of test points. In a real context, there are hundreds of groups of test points making it, in most cases, thousands of test points. The positive measuring signal (23) is a signal of a measuring instrument that applies voltage or current in order to make measurements. While the negative measuring signal (24) is a signal of a measuring instrument that applies voltage or current in order to make measurements.

FIG. 1 represents in a simplified way a module of a switching matrix with only three test points, which is composed by modules of a variable number of test points and has the final objective of directing lines SEP (23) and SEN (24) to different test points (20, 21, 22 . . . ) in order to carry out a set of measurements aiming at the validation of a product. This approach results from the association of a solid-state matrix with a matrix based on electromechanical relays and enables three fundamental states:

Isolation: This state consists in switching off all contacts from one, several or all the modules of the switching matrix. This state allows, on one hand, to minimize the consumption of the switching matrix when there's no test running and, on the other hand, if necessary, to disconnect only some modules of the switching matrix through the contacts identified on the picture by the reference numbers 1 and 2, when there is no need of those for the ongoing test, in this way reducing above all the capacitive and resistive effect of the switching matrix on the ongoing measurements.

Low voltage test: In this state the contacts identified on the picture with the reference numbers 5 to 10 are open and the contacts identified on the picture with the reference numbers 17, 18 and 19 of the modules necessary for the test are closed. Furthermore, contacts 3 and 4, 1 and 2 of the modules necessary for the test are also closed thus enabling the use of the contacts of the solid-state matrix 11 to 16 for the needed tests.

Medium/high voltage test: In this state, all contacts 3, 4 and 11 to 16 are open and the contacts 1 and of the modules necessary for the test are closed thus enabling to use the contacts of the electromechanical relays matrix 5 to 10 for the needed tests.

In one embodiment, the test of a wiring or a control panel is divided into two phases:

making use of the solid-state matrix to test the conductors' continuity, measure resistances, diodes and other components, and also to test the insulation at low voltage;

making use of the electromechanical relays matrix to perform functional tests on components such as relays, signalling sets, etc . . . , to perform insulation tests at high voltage, and to perform also dielectric strength tests at high voltage.

Figure 2:
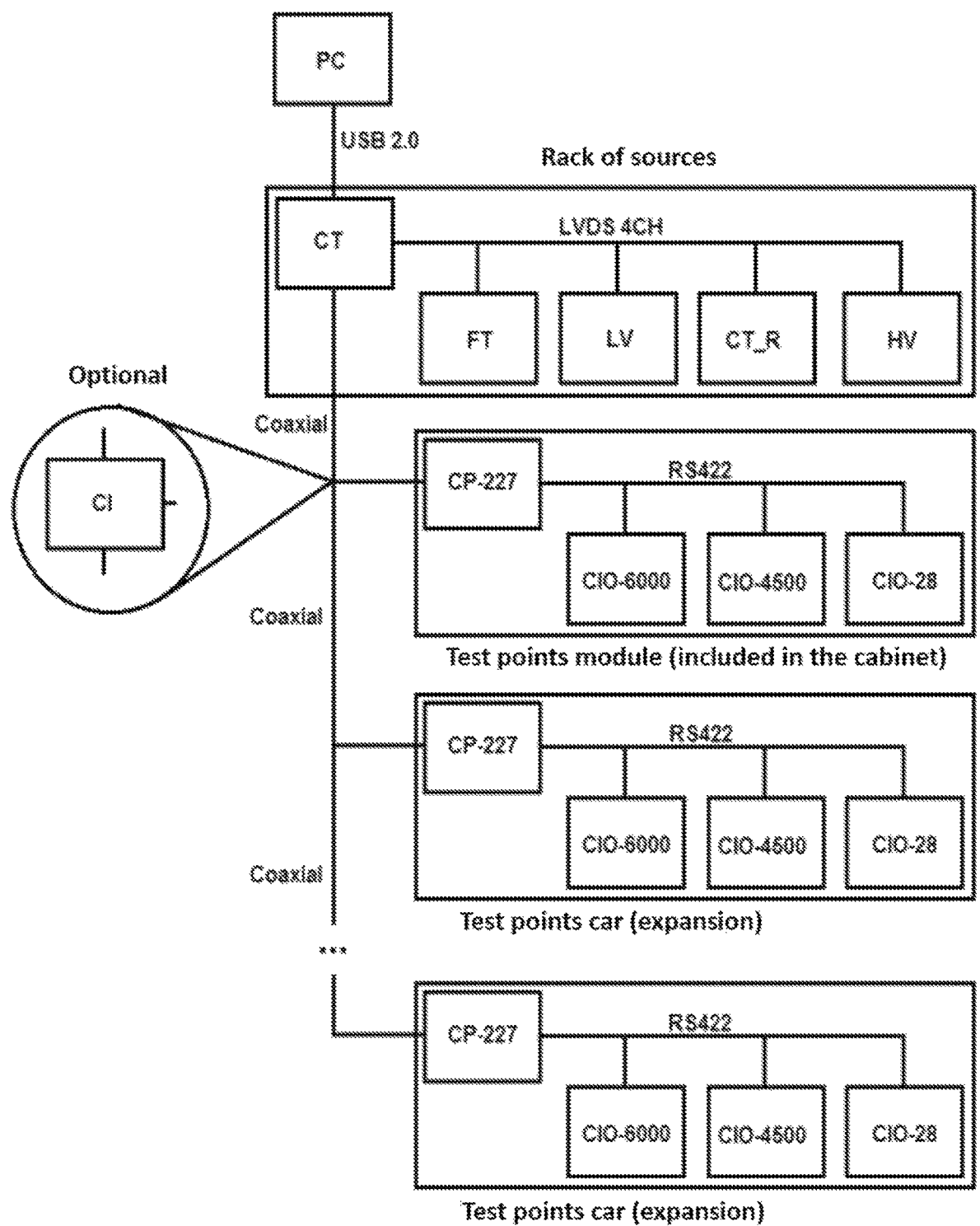
FIG. 2 illustrates an embodiment of the automated test equipment.

FIG. 2 illustrates another embodiment of the automated test equipment. Use is made of a computer running a software developed for this purpose on which test sequences to be carried out and parameters, as well as validation criteria are configured. The software communicates with the Hardware using the main electronic controller, the CP-232 card identified as CT on the picture, which comprises a communication card USB 2.0 and by different ways communicates with all elements of the equipment.

In what respects the switching matrix, it consists of sets of test points distributed according to the needs. The sets of test points are networked with a CT card via a coaxial cable. In this network the CT card is master and there are other CP-227 cards which are slaves.

Each set of test points is controlled by a CP-227 card that is like a network card (gateway) establishing the bridge between the CT card and the cards of the test points matrix. Each CP-227 card has a unique address in the network through which the CT card identifies it and communicates with it making use of a protocol created for this purpose, which includes error detection methods.

Each CP-227 card controls several cards of the switching matrix (test points cards). Each test point card, which we designate CIO-xxx (wherein xxx identifies the type of card) may have a number of test points varying according to the maximum test voltage or maximum current. These cards are installed in racks as the one in FIG. 2 and in each rack a CO-227 card is also installed.

In the embodiments above, in practice, a reduction by half of the test time at the low voltage step is observed.

The present description is not, naturally, in any way restricted to the implementations presented herein and a person with average knowledge in the area may foresee many possibilities for modification thereof without departing from the main idea, as per defined in the claims.

The invention claimed is:

1. An automated test equipment, comprising:
    an electronic controller comprising a non-volatile memory where test sequences to be performed are loaded;
    at least two measuring lines, the at least two measuring lines being a first measuring line and a second measuring line;
    at least one first switching matrix comprising at least one test point and at least two electromechanical relays for each of the at least one test point, each of the at least two electrochemical relays connected between the first measuring line and the at least one test point;
    at least one second switching matrix comprising at least two solid-state relays for each of the at least one test point, each of the at least two solid-state relays connected between the second measuring line and the at least one test point,
    wherein each of the at least one test point in the at least one first switching matrix is connected to the at least one second switching matrix via a corresponding electromechanical relay.

2. The automated test equipment according to claim 1, wherein each measuring line is connected to the at least one switching matrix comprising at least two solid-state relays, via a corresponding electromechanical relay.

3. The automated test equipment according to claim 1, wherein each measuring line is connected to the at least one first and switching matrix and the at least one second switching matrix, via a corresponding electromechanical relay.

4. The automated test equipment according to claim 1, wherein the electronic controller comprises:
    a main electronic controller;
    at least one sub-controller of test points module;
    at least one test points card,
    wherein the main electronic controller is connected to the at least one sub-controller of test points module, which in turn is connected to the at least one test points card.

5. The automated test equipment according to claim 4, wherein the electronic controller is configured to:
    read an instruction from the non-volatile memory;
    deactivate the at least one electromechanical relay between the test points;
    activate the at least one electromechanical relay between the test points and deactivates the at least two relays in the at least one switching matrix comprising the at least two electromechanical relays.

* * * * *